(12) United States Patent
Ishii et al.

(10) Patent No.: US 8,860,430 B2
(45) Date of Patent: Oct. 14, 2014

(54) INSULATION RESISTANCE MEASUREMENT DEVICE AND INSULATION RESISTANCE MEASUREMENT METHOD

(75) Inventors: Takafumi Ishii, Tokyo (JP); Masanobu Yoshidomi, Nagoya (JP)

(73) Assignees: JX Nippon Oil & Energy Corporation, Tokyo (JP); Yoshidomi Electric, Aichi (JP); Nippon Yusen Kabushiki Kaisha, Tokyo (JP); Monohakobi Technology Institute, Tokyo (JP)

( * ) Notice: Subject to any disclaimer, the term of this patent is extended or adjusted under 35 U.S.C. 154(b) by 364 days.

(21) Appl. No.: 13/379,515

(22) PCT Filed: May 18, 2010

(86) PCT No.: PCT/JP2010/058378
§ 371 (c)(1),
(2), (4) Date: Jan. 31, 2012

(87) PCT Pub. No.: WO2010/150601
PCT Pub. Date: Dec. 29, 2010

(65) Prior Publication Data
US 2012/0119755 A1    May 17, 2012

(30) Foreign Application Priority Data
Jun. 22, 2009   (JP) ............................... P2009-147628

(51) Int. Cl.
*G01R 31/02*   (2006.01)
*G01R 27/18*   (2006.01)
*G01R 27/02*   (2006.01)
*G01R 31/14*   (2006.01)

(52) U.S. Cl.
CPC .............. *G01R 27/025* (2013.01); *G01R 27/18* (2013.01); *G01R 31/025* (2013.01); *G01R 31/14* (2013.01)

USPC .......................................................... 324/551

(58) Field of Classification Search
USPC ................... 324/551, 762.01–762.1
See application file for complete search history.

(56) References Cited

U.S. PATENT DOCUMENTS 4,409,538 A * 10/1983 Tabata ......................... 320/162
4,532,220 A    7/1985 Lavi
(Continued)

FOREIGN PATENT DOCUMENTS

| CN | 101042418 | 9/2007 |
|----|-----------|--------|
| EP | 1 408 594 | 4/2004 |

(Continued)

OTHER PUBLICATIONS

International Preliminary Report on Patentability of PCT/JP2010/058378, dated Jan. 26, 2012.

(Continued)

*Primary Examiner* — Tung X Nguyen
(74) *Attorney, Agent, or Firm* — Greenblum & Bernstein, P.L.C.

(57) ABSTRACT

An object is to detect an insulation failure of a DC circuit with high sensitivity and in safety by means of a simple detection circuit. An insulation resistance measurement device of this invention is a device for measuring an insulation resistance to ground of a DC source circuit and is provided with connection terminals for connections to a positive electrode and a negative electrode of a series power supply, switch elements connected between the connection terminals and the ground potential and configured to switch connections between the connection terminals and the ground potential, resistive elements connected through the switch elements between the connection terminals respectively, and the ground potential, and a voltage detection unit for detecting voltage drops in the resistive elements.

10 Claims, 6 Drawing Sheets

(56) References Cited

U.S. PATENT DOCUMENTS 7,200,186 B2 * 4/2007 Schoenborn ............... 375/316
2007/0285057 A1 12/2007 Yano

FOREIGN PATENT DOCUMENTS

| | | |
|---|---|---|
| JP | 57-173765 | 10/1982 |
| JP | 04-166773 | 6/1992 |
| JP | 06-153301 | 5/1994 |
| JP | 2003-158282 | 5/2003 |
| JP | 2004-153991 | 5/2004 |
| JP | 2006-343267 | 12/2006 |
| JP | 2007-327856 | 12/2007 |

OTHER PUBLICATIONS

Japan Office action, mail date is May 21, 2013.
China Office action, mail date is Oct. 10, 2013.
Japan Office action, mail date is Jan. 7, 2014.

* cited by examiner

INSULATION RESISTANCE MEASUREMENT DEVICE AND INSULATION RESISTANCE MEASUREMENT METHOD

TECHNICAL FIELD

The present invention relates to an insulation resistance measurement device and an insulation resistance measurement method for measurement of an insulation resistance to ground of a DC circuit.

BACKGROUND ART

Detection of a ground fault has been considered heretofore to be important as a safety countermeasure for a DC circuit such as a source circuit. If there is a ground fault point in the DC circuit, it will induce an electric shock accident upon contact with the insulation failure point of the DC circuit, and two ground fault points could cause a fire. One of methods for detection of such a ground fault is, as described in Patent Literature 1 below, a method of detecting a difference between amounts of direct currents flowing through a plurality of DC lines, through a detection core and thereby detecting a DC ground fault occurring in the measurement target lines. The other known methods include a method of connecting an AC power supply through a resistive element to a measurement point of a DC circuit and detecting the presence/absence of a ground fault by determining whether there is an in-phase component with an applied voltage in an electric current flowing through the resistor component, and a method of connecting a DC power supply and a resistive element between a measurement point of a DC circuit and the ground potential, applying a DC bias to the measurement point, and measuring a leak current through the resistive element, thereby detecting the present/absence of a ground fault.

CITATION LIST

Patent Literature

Patent Literature 1 Japanese Patent Application Laid-open No. 2004-153991

SUMMARY OF INVENTION

Technical Problem

In the detection method described in Patent Literature 1 above, however, the ground fault current can be detected only if it actually flows, but it is difficult to detect an insulation failure with a potential risk leading to a ground fault. In the method of connecting the AC power supply to the DC circuit, it is necessary to detect the phase difference of the electric current flowing in the resistive element, and therefore it tends to complicate the configuration of the detection circuit. Furthermore, in the method of applying the DC bias to the DC circuit, the detection sensitivity depends to a large extent on ground fault points and the application of the unnecessary DC voltage itself is unfavorable because it can cause a ground fault or a failure of the DC circuit.

The present invention has been accomplished in view of the above-described problems and it is therefore an object of the present invention to provide an insulation resistance measurement device and an insulation resistance measurement method permitting high-sensitivity and safe detection of the insulation failure of the DC circuit by means of a simple detection circuit.

Solution to Problem

In order to solve the above problems, an insulation resistance measurement device according to the present invention is an insulation resistance measurement device for measuring an insulation resistance to ground of a DC circuit, comprising: first and second connection terminals for connections to two measurement points of the DC circuit; a switching unit connected between the first and second connection terminals and the ground potential and configured to switch connections between the first and second connection terminals and the ground potential; at least one resistive element connected through the switching unit between the first and second connection terminals and the ground potential; and a voltage detection unit which detects voltage drops in the resistive element.

According to the insulation resistance measurement device of this configuration, the first and second connection terminals are connected respectively to the two measurement points of the DC circuit and the switching unit is exclusively switched to the first connection terminal and to the second connection terminal, whereby the voltage detection unit can separately detect the voltage drop in the resistive element connected between one connection point and the ground potential and the voltage drop in the resistive element connected between the other connection point and the ground potential. As a consequence, the insulation resistance to ground of the DC circuit can be derived based on values of the two voltage drops. Therefore, the insulation resistance measurement device is able to perform high-sensitivity detection of the insulation failure of the DC circuit, irrespective of insulation failure points, by means of the simple detection circuit and also ensure safety during the detection because there is no need for application of unnecessary voltage.

As another aspect, an insulation resistance measurement method according to the present invention is an insulation resistance measurement method for measuring an insulation resistance to ground of a DC circuit, comprising: a step of connecting a resistive element between a first measurement point of the DC circuit and the ground potential and detecting a first voltage drop occurring in the resistive element; a step of connecting a resistive element identical to or different from the aforementioned resistive element, between a second measurement point of the DC circuit and the ground potential and detecting a second voltage drop occurring in the resistive element; and a step of calculating the insulation resistance to ground, based on values of the first and second voltage drops.

According to the insulation resistance measurement method as described above, the first connection terminal is connected to the first measurement point of the DC circuit, the voltage drop is detected in the resistive element connected between the first connection point and the ground potential, the second connection terminal is then connected to the second measurement point of the DC circuit, and the voltage drop is detected in the resistive element connected between the second connection point and the ground potential. Then the insulation resistance to ground of the DC circuit is derived based on the values of the two voltage drops. This enables high-sensitivity detection of the insulation failure of the DC circuit, irrespective of insulation failure points, by the simple detection circuit and also ensures safety during the detection because there is no need for application of unnecessary voltage.

Advantageous Effects of Invention

The insulation resistance measurement device of the present invention is able to perform the high-sensitivity and safe detection of the insulation failure of the DC circuit by means of the simple detection circuit.

DESCRIPTION OF EMBODIMENTS

The preferred embodiments of the insulation resistance measurement device and insulation resistance measurement method according to the present invention will be described below in detail with reference to the drawings. In the description of the drawings identical or equivalent portions will be denoted by the same reference signs, without redundant description.

Figure 1:
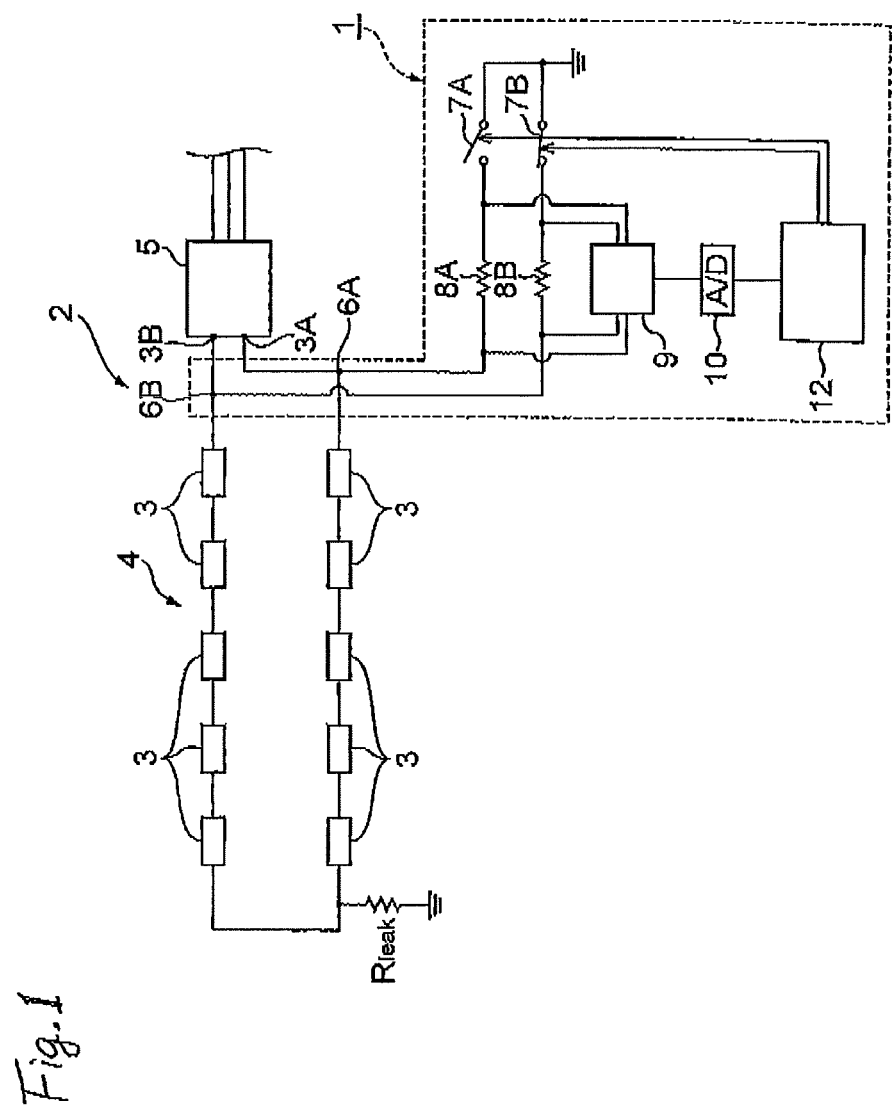
FIG. 1 is a circuit block diagram showing a configuration of an insulation resistance measurement device according to a preferred embodiment of the present invention, along with a DC source circuit as a measurement object.

FIG. 1 is a circuit block diagram showing the configuration of the insulation resistance measurement device 1 according to a preferred embodiment of the present invention, along with a DC source circuit 2 which is an object to be measured. As shown in the same drawing, the insulation resistance measurement device 1 is a device for measuring the insulation resistance to ground, for the object of the DC source circuit 2 including a series power supply 4 in which a plurality of solar cell modules 3 are connected in series, and an inverter circuit 5 connected to a positive electrode 3A and a negative electrode 3B of the series power supply 4 and configured to convert a DC voltage into a three-phase AC voltage. The inverter circuit 5 of the DC source circuit 2 to be used herein is an isolated inverter circuit with a built-in transformer for preventing an electric shock upon contact with an insulation failure point of the series power supply 4.

The insulation resistance measurement device 1 has two connection terminals 6A, 6B for connections to two measurement points of the DC source circuit 2. These connection terminals 6A, 6B may be connected, for example, to the positive electrode 3A and the negative electrode 3B of the series power supply 4, but they may be connected to any other connection points of the series power supply 4.

A switch element (switching unit) 7A for turning on or off the connection between the connection terminal 6A and the ground potential is connected between the connection terminal 6A and the ground potential and a switch element (switching unit) 7B for turning on or off the connection between the connection terminal 6B and the ground potential is connected between the connection terminal 6B and the ground potential. These switch elements 7A, 7B applicable herein can be semiconductor switches such as FETs, or mechanical switches.

Furthermore, a resistive element 8A with the resistance $R_d$ is connected in series through the switch element 7A between the connection terminal 6A and the ground potential, and a resistive element 8B with the resistance $R_d$ equal to that of the resistive element 8A is connected in series through the switch element 7B between the connection terminal 6B and the ground potential. More specifically, the resistive element 8A is connected between the connection terminal 6A and the switch element 7A and the resistive element 8B is connected between the connection terminal 6B and the switch element 7B.

The resistance $R_d$ of the resistive elements 8A, 8B can be optionally set according to a detection range of insulation resistance values and a permissible period of detection time, but when the ground capacitance of the series power supply 4 is $C_0$ [F], the resistance $R_d$ is preferably set to be not less than a half of the detection range of insulation resistance values and not more than the detection time $[\text{sec}]/(3 \times C_0[F])$. The reasons for it are as follows: if the resistance $R_d$ is extremely smaller than the detection range of insulation resistance values, the insulation resistance measurement device 1 itself will induce a ground fault state so as to raise an issue of safety; the lapse of the time determined by the ground capacitance $C_0$ and the resistance $R_d$ is needed for bringing the detected voltage by the insulation resistance measurement device 1 from a transient state into a steady state. For example, in a case where $C_0=1$ μF and where the insulation resistance of 100 kΩ is desired to be detected in the detection time of 1 sec, the resistance is preferably set in the range of 50 kΩ≤$R_d$≤300 kΩ.

In addition, a voltage detection unit 9 for detecting voltage drops between two ends of the resistive elements 8A, 813 is connected to the two ends of the resistive elements 8A, 8B, an A/D converter 10 for analog-to-digital conversion of detected signals is connected to an output for detected signals of the voltage detection unit 9, and an operation unit 12 to calculate the insulation resistance to ground of the DC source circuit 2 on the basis of the converted detected signals is connected to an output of the A/D converter 10.

The operation unit 12 has a function to calculate the insulation resistance to ground and also has functions to generate control signals for turning on or off the switch elements 7A, 7B and to send them to the switch elements 7A, 7B. The operation unit 12 of this kind applicable herein may be a general-purpose computer typified by a personal computer, or an analog IC circuit or a PLD (Programmable Logic Device) circuit.

Specifically, when the operation unit 12 turns on the switch element 7A and turns off the switch element 7B out of the switch elements 7A, 7B, i.e., when it switches the connection to the ground potential over to the connection terminal 6A, it receives a detected voltage value $V_1$ generated by the voltage detection unit 9, as a digital signal via the A/D converter 10 and saves it in a built-in memory (not shown). Furthermore, when the operation unit 12 turns off the switch element 7A and turns on the switch element 7B out of the switch elements 7A, 7B, i.e., when it switches the connection to the ground potential over to the connection terminal 6B, it receives a detected voltage value $V_2$ generated by the voltage detection unit 9, as a digital signal via the A/D converter 10. Then the operation unit 12 reads the detected voltage value $V_1$ saved in the built-in memory and calculates the insulation resistance to ground $R_{leak}$, based on the following formula (1):

$$R_{leak}=R_d \times |V_0/(V_1-V_2)|-R_d \qquad (1),$$

based on the two detected voltage values $V_1$, $V_2$. The voltage value $V_0$ herein represents a potential difference between the positive electrode 3A and the negative electrode 3B being the two measurement points of the series power supply 4, which is a known value. Furthermore, the operation unit 12 outputs the insulation resistance to ground $R_{leak}$ thus calculated, to any of various output devices such as a built-in or external display device.

Figure 2:
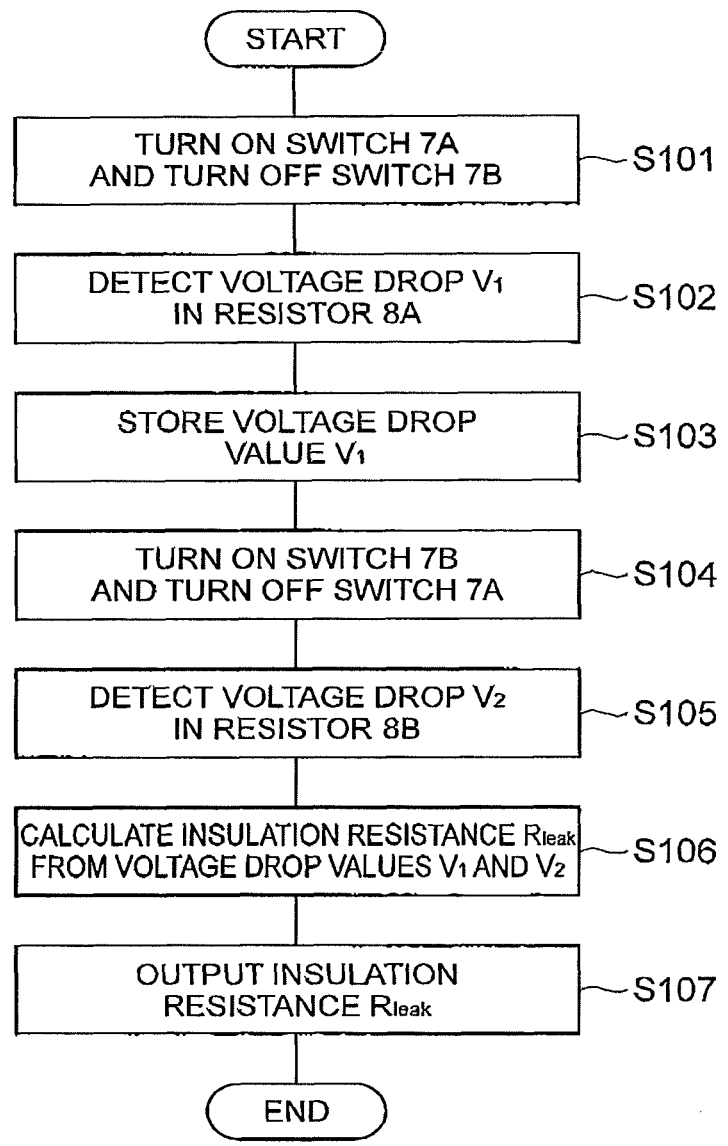
FIG. 2 is a flowchart showing an insulation resistance measurement method by the insulation resistance measurement device of FIG. 1.

The below will describe the operation of the insulation resistance measurement device 1, while detailing the insulation resistance measurement method according to the present embodiment, with reference to FIG. 2.

First, the connection terminals 6A, 6B are connected respectively to the positive electrode 3A. and the negative electrode 3B of the series power supply 4 and, thereafter, at an occasion of a predetermined manipulated input into the operation unit 12, the operation unit 12 sends a control signal for turn-off of the switch element 7B to the switch element 7B and simultaneously sends a control signal for turn-on of the switch element 7A to the switch element 7A. In order to avoid a risk of simultaneous turn-on of the switch element 7A and the switch element 7B, it is also possible to turn on the switch element 7A after a lapse of a predetermined wait time, after turn-off of the switch element 7B (step S101). This step results in connecting the resistive element 8A between the positive electrode 3A of the series power supply 4 and the ground potential. At this time, the voltage detection unit 9 detects a voltage drop in the resistive element 8A and the detected voltage $V_1$ is sent via the A/D converter 10 to the operation unit 12 (step S102). As receiving it, the operation unit 12 saves the voltage drop value $V_1$ of the resistive element 8A into the built-in memory (step S103). It is preferable to interpose a predetermined wait time, as described below, between the turn-on of the switch element 7A and the acquisition of the voltage drop value $V_1$.

Thereafter, the operation unit 12 sends a control signal for turn-off of the switch element 7A to the switch element 7A and at the same time as it or after a lapse of a predetermined wait time for avoiding the risk of simultaneous turn-on of the two switches, the operation unit 12 sends a control signal for turn-on of the switch element 7B to the switch element 7B (step S104). This step results in connecting the resistive element 8B between the negative electrode 3B of the series power supply 4 and the ground potential. At this time, the voltage detection unit 9 detects a voltage drop in the resistive element 8B and the detected voltage $V_2$ is sent via the A/D converter 10 to the operation unit 12 (step S105). It is preferable to interpose a predetermined wait time, as described below, between the turn-on of the switch element 7B and the acquisition of the voltage drop value $V_2$. As receiving it, the operation unit 12 reads the voltage drop value $V_1$ from the built-in memory and applies the voltage drop values $V_1$, $V_2$ to the aforementioned formula (1) to calculate the insulation resistance to ground $R_{leak}$ of the DC source circuit 2 (step S106). Finally, the insulation resistance to ground $R_{leak}$ thus calculated is output to the output device (step S107).

It is noted herein that immediately after the switching of the switch elements 7A, 7B, an electric current due to the ground capacitance of the DC source circuit 4 flows in the resistive elements 8A, 8B in that state, and it is thus preferable to interpose the predetermined wait time. This wait time suitably applicable is not less than twice, preferably not less than three times, the value obtained by dividing the ground capacitance by the resistance of the resistive elements 8A, 8B. Without interposition of this wait time, measurements of insulation resistance to ground could include significant error.

According to the insulation resistance measurement device 1 and the insulation resistance measurement method using it as described above, the connection terminals 6A, 6B are connected respectively to the two measurement points of the series power supply 4 and the switch elements 7A, 7B are exclusively switched to the connection terminal 6A and to the connection terminal 6B, whereby the voltage detection unit 9 can separately detect the voltage drop in the resistive element 8A connected between one connection point and the ground potential and the voltage drop in the resistive element 8B connected between the other connection point and the ground potential. As a result, the insulation resistance to ground of the DC source circuit 2 can be derived based on the two voltage drop values. Therefore, the insulation resistance measurement device is able to detect the insulation failure of the DC circuit, irrespective of insulation failure points, with high sensitivity by the simple detection circuit composed of the switch elements, the resistive elements, and so on, while ensuring safety during the detection because there is no need for application of an unnecessary voltage to the measurement object.

Figure 4:
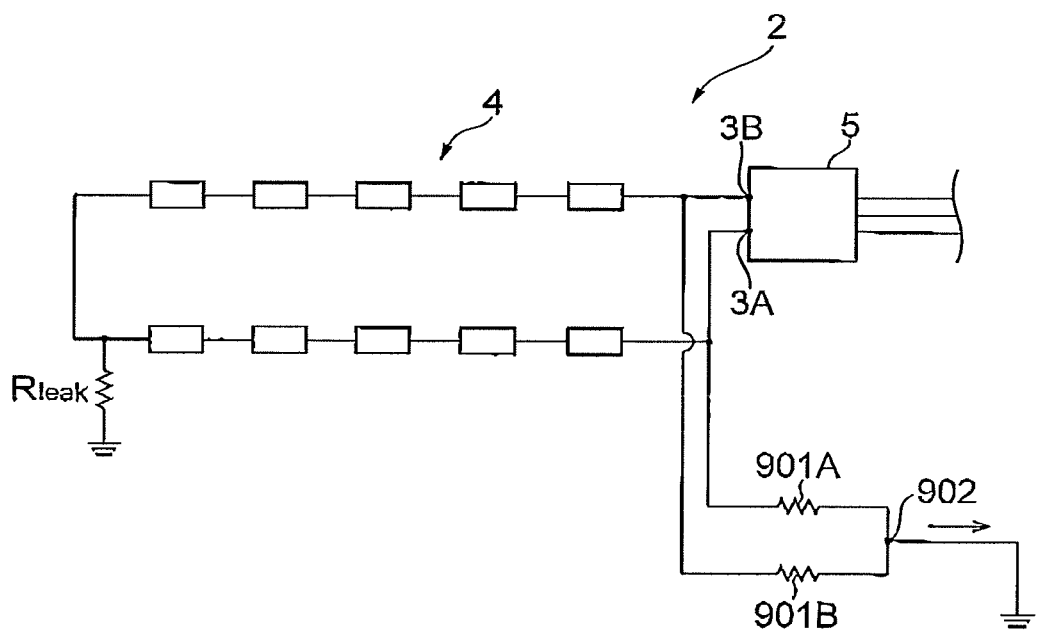
FIG. 4 is a circuit block diagram for explaining an insulation resistance measurement method according to a comparative example of the present invention.

The advantages of the present embodiment will be specifically described in comparison to comparative examples. First, it can be contemplated that, as shown in FIG. 4, the ground fault of the DC source circuit 2 is detected by connecting resistive elements 901A, 901B in parallel between the positive and negative electrodes 3A and 3B of the series power supply 4 and the ground potential and monitoring a leak current flowing from a connection point 902 between the resistive element 901A and the resistive element 901B to the ground potential. However, this detection method is unable to detect the ground fault at an electrical midpoint of the series power supply 4. In contrast to it, the insulation resistance measurement device 1 is able to detect the insulation resistance at any point.

Figure 5:
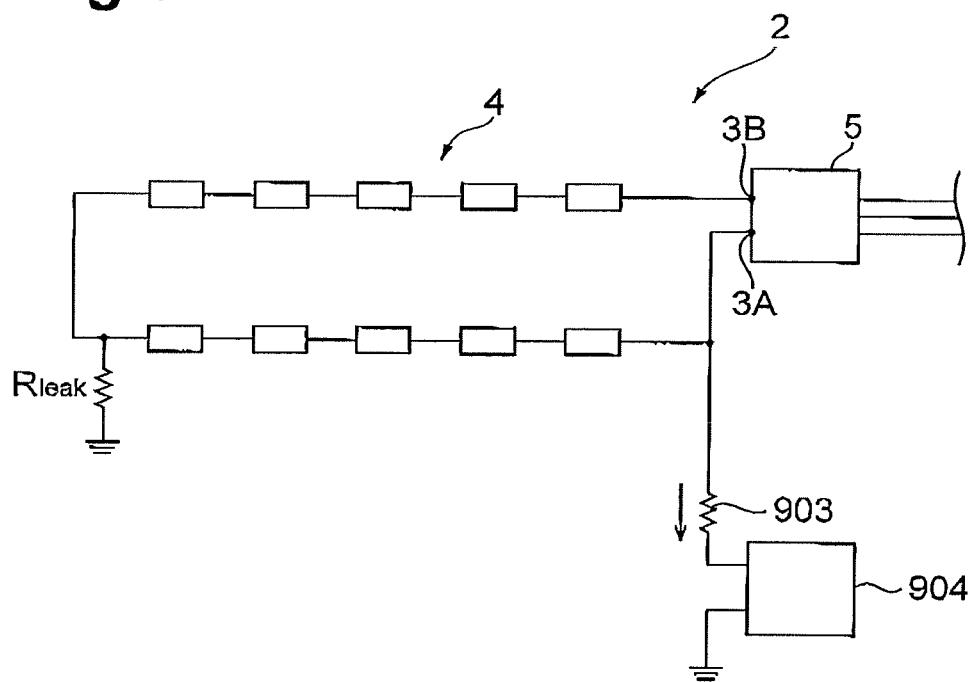
FIG. 5 is a circuit block diagram for explaining an insulation resistance measurement method according to another comparative example of the present invention.

On the other hand, it can also be contemplated that, as shown in FIG. 5, the ground fault of the DC source circuit 2 is detected by connecting a resistive element 903 and an AC power supply 904 to an arbitrary measurement point such as the positive electrode 3A of the series power supply 4 and determining whether there is an in-phase component (resistive component) with an AC voltage in the voltage drop in the resistive element 903. However, this detection method requires detection of the phase of the voltage drop and thus tends to complicate the configuration of the detection circuit. In contrast to it, the insulation resistance measurement device 1 adopts the technique of detecting the two voltage drop values and calculating the insulation resistance based thereon, and thus simplifies the detection circuit while ensuring high reliability.

Figure 6:
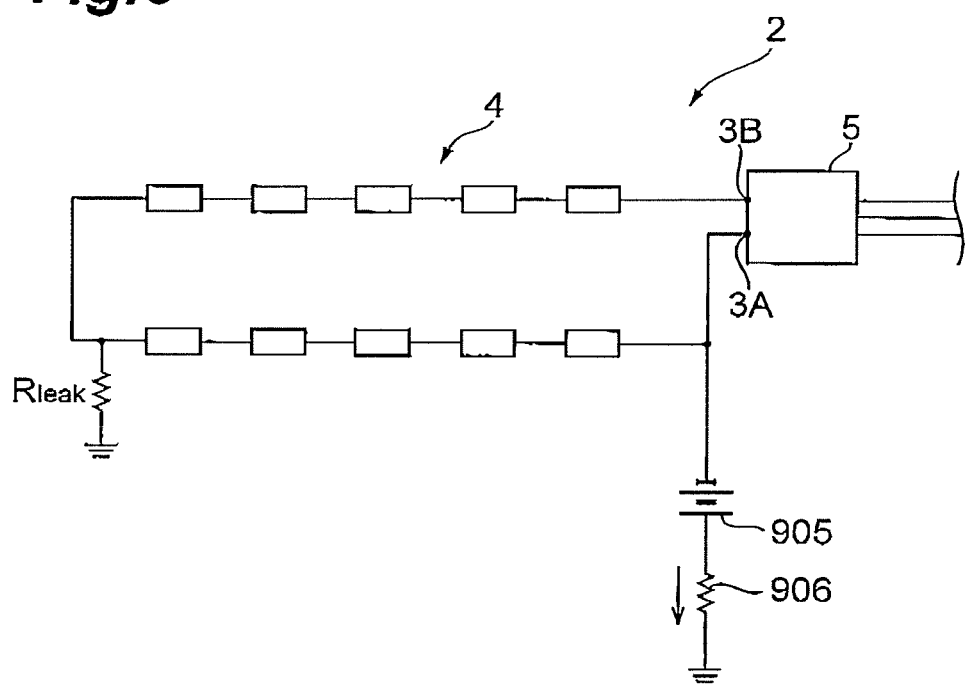
FIG. 6 is a circuit block diagram for explaining an insulation resistance measurement method according to still another comparative example of the present invention.

Furthermore, it can also be contemplated that, as shown in FIG. 6, the ground fault of the DC source circuit 2 is detected by connecting a DC power supply 905 and a resistive element 906 to an arbitrary measurement point such as the positive electrode 3A of the series power supply 4 and monitoring a leak current through a high resistance with application of a DC bias to the measurement point. In this case, there are problems such as considerable change in detection sensitivity depending upon ground fault points and application of an unnecessary high voltage to the DC source circuit 2. In contrast to it, the insulation resistance measurement device 1 is able to detect the insulation resistance at any point of the series power supply 4 and requires no application of unnecessary voltage.

Since the switch element 7A and the resistive element 8A are connected to the ground potential, separately from the switch element 7B and the resistive element 8B, the insulation resistance measurement device 1 can minimize an unwanted electric current flowing through the DC source circuit 2 in the event of occurrence of a short circuit due to accidental simultaneous closure of the switch elements 7A, 7B.

Furthermore, since the resistive element 8A and the resistive element 8B have the equal resistance, the insulation resistance to ground $R_{leak}$ can be readily calculated based on the voltage drop values $V_1$, $V_2$ of the resistive elements 8A, 8B and the potential difference $V_0$ between the positive electrode 3A and the negative electrode 3B of the series power supply 4.

Yet furthermore, since the measurement object is the DC source circuit 2 including the solar cell modules 3 with relatively long wires and a large installation area, the insulation resistance measurement device 1 effectively performs the highly sensitive detection of insulation resistance.

Figure 3:
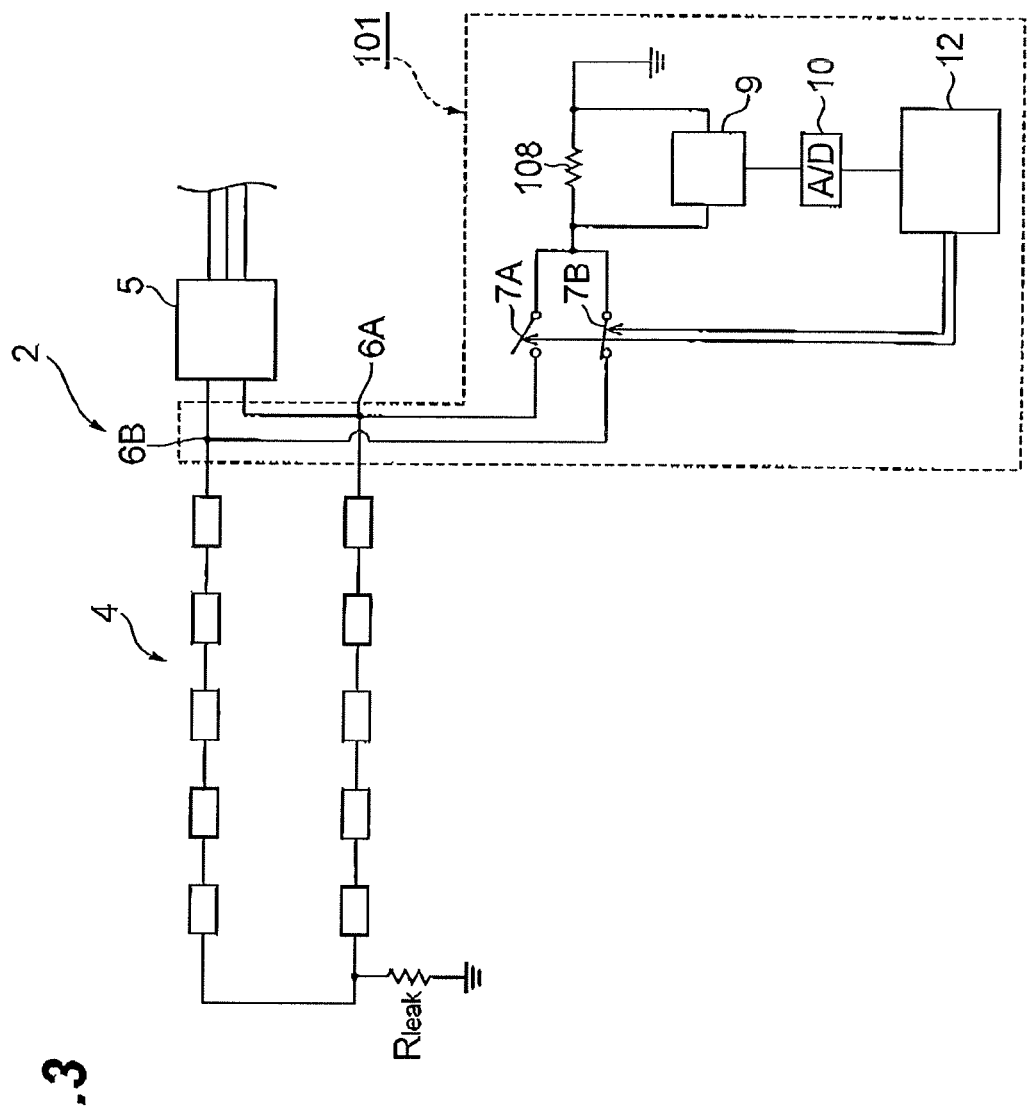
FIG. 3 is a circuit block diagram showing a configuration of an insulation resistance measurement device according to a modification example of the present invention, along with a DC source circuit as a measurement object.

It should be noted that the present invention is by no means limited to the above-described embodiment. For example, the insulation resistance measurement device may be provided with at least one resistive element like an insulation resistance measurement device 101 which is a modification example of the present invention shown in FIG. 3; specifically, the insulation resistance measurement device may be provided with a resistive element 108 connected in common between the two switch elements 7A, 7B and the ground potential. In this case, the insulation resistance to ground $R_{leak}$ can also be calculated by detecting the voltage drops in the resistive element 108 by the voltage detection unit 9 while alternately switching the switch elements 7A, 7B. This configuration can further simply the circuit configuration.

The operation unit 12 may be realized not only by the digital circuit with the function to save the voltage drop value in the built-in memory, but also by an analog circuit with a built-in hold circuit for holding a level of an analog signal. The MD converter 10 may be omitted accordingly. In this case, it is necessary to avoid capture of an input signal so as to prevent the hold element from acquiring the voltage drop value during the period of the wait time interposed between the turn-on of the switch element 7A or 7B and the acquisition of the voltage drop value $V_1$ or $V_2$. In this case, furthermore, the operation unit 12 itself does not have to determine the timing of the operations of the switch elements and the timing of the operation of the hold circuit, but it is also possible to determine such timing according to indications of a separately provided timer.

Preferably, the insulation resistance measurement device further comprises the operation unit which calculates the insulation resistance to ground, based on the voltage drop value detected by the voltage detection unit upon switching the switching unit to the first connection terminal and the voltage drop value detected by the voltage detection unit upon switching the switching unit to the second connection terminal. In this case, the insulation resistance measurement device is able to detect the insulation failure of the DC circuit with high sensitivity and at once.

The insulation resistance measurement device is also preferably configured as follows: the switching unit has the first switch element connected between the first connection terminal and the ground potential and the second switch element connected between the second connection terminal and the ground potential; the resistive element has the first resistive element connected between the first connection terminal and the first switch element and the second resistive element connected between the second connection terminal and the second switch element.

This configuration can minimize an unwanted electric current flowing through the DC circuit in the event of occurrence of accidental simultaneous closure of the first switch element and the second switch element.

Furthermore, the insulation resistance measurement device is also preferably configured so that the first resistive element and the second resistive element have the equal resistance. This configuration allows the insulation resistance to ground to be readily calculated based on the voltage drop values of the first and second resistive elements and the potential difference between the two measurement points of the DC circuit.

Yet furthermore, the DC circuit is preferably one including the solar cell module. Since the DC circuit including the solar cell module tends to have long wires and a large installation area, it is more effective to use the insulation resistance measurement device of the present invention.

In the insulation resistance measurement method, preferably, the resistance of the resistive element corresponding to the first voltage drop is equal to the resistance of the resistive element corresponding to the second voltage drop. In this case, the insulation resistance to ground can be readily calculated based on the voltage drop values of the two resistive elements and the potential difference between the two measurement points of the DC circuit.

The first and second measurement points are preferably either the positive electrode or the negative electrode of the DC source circuit. This configuration allows an insulation failure point of the DC source circuit to be efficiently detected throughout the entire circuit.

Furthermore, the DC circuit is preferably one including the solar cell module. Since the DC circuit including the solar cell module tends to have long wires and a large installation area, it is more effective to use the insulation resistance measurement method of the present invention.

INDUSTRIAL APPLICABILITY

The present invention is applicable to the insulation resistance measurement device and the insulation resistance measurement method, while enabling the high-sensitivity and safe detection of the insulation failure of the DC circuit by means of the simple detection circuit.

LIST OF REFERENCE SIGNS 1, 101 insulation resistance measurement device; 2 DC source circuit; 3 solar cell modules; 3A positive electrode; 3B negative electrode; 6A, 6B connection terminals; 7A, 7B, switch elements; 8A, 8B, 108 resistive elements; 9 voltage detection unit; 12 operation unit.

The invention claimed is:

1. An insulation resistance measurement device for measuring an insulation resistance to ground of a DC circuit, comprising:

first and second connection terminals for connections to two measurement points of the DC circuit;

a switch connected between the first and second connection terminals and the ground potential and that switches connections between the first and second connection terminals and the ground potential such that when one of the first and second connection terminals is connected to the ground potential, an other of the first and second connection terminals is not connected to the ground potential;

at least one resistive element connected through the switch between the first and second connection terminals and the ground potential; and a voltage detector which detects a voltage drop in the resistive element.

2. The insulation resistance measurement device according to claim 1, further comprising: a calculator that calculates the insulation resistance to the ground, based on a value of the voltage drop detected by the voltage detector upon switching the switch to the first connection terminal and a value of the voltage drop detected by the voltage detector upon switching the switch to the second connection terminal.

3. The insulation resistance measurement device according to claim 1, wherein the switch has a first switch element connected between the first connection terminal and the ground potential, and a second switch element connected between the second connection terminal and the ground potential, and wherein the resistive element has a first resistive element connected between the first connection terminal and the first switch element, and a second resistive element connected between the second connection terminal and the second switch element.

4. The insulation resistance measurement device according to claim 3, wherein the first resistive element and the second resistive element have an equal resistance.

5. The insulation resistance measurement device according to claim 1, wherein the DC circuit comprises a solar cell module.

6. An insulation resistance measurement method for measuring an insulation resistance to ground of a DC circuit, comprising:

connecting a first resistive element between a first measurement point of the DC circuit and the ground potential and detecting a first voltage drop occurring in the first resistive element;

connecting a second resistive element identical to or different from the first resistive element between a second measurement point of the DC circuit and the ground potential and detecting a second voltage drop occurring in the second resistive element; and calculating the insulation resistance to the ground, based on values of the first and second voltage drops.

7. The insulation resistance measurement method according to claim 6, wherein the first resistive element corresponding to the first voltage drop and the second resistive element corresponding to the second voltage drop have an equal resistance.

8. The insulation resistance measurement method according to claim 6, wherein the first and second measurement points are either a positive electrode or a negative electrode of a DC source circuit.

9. The insulation resistance measurement method according to claim 6, wherein the DC circuit comprises a solar cell module.

10. An insulation resistance measurement device for measuring an insulation resistance to ground of a DC circuit, comprising:

first and second connection terminals for connections to two measurement points of the DC circuit;

a switch connected between the first and second connection terminals and the ground potential and that switches connections between the first and second connection terminals and the ground potential;

at least one resistive element connected through the switch between the first and second connection terminals and the ground potential; and a voltage detector which detects a voltage drop in the resistive element; and a calculator that calculates the insulation resistance to the ground, based on a value of the voltage drop detected by the voltage detector upon switching the switch to the first connection terminal and a value of the voltage drop detected by the voltage detector upon switching the switch to the second connection terminal.

\* \* \* \* \*